United States Patent
Ventrone et al.

(10) Patent No.: US 9,871,020 B1
(45) Date of Patent: Jan. 16, 2018

(54) THROUGH SILICON VIA SHARING IN A 3D INTEGRATED CIRCUIT

(71) Applicant: GLOBALFOUNDRIES INC., Grand Cayman (KY)

(72) Inventors: Sebastian T. Ventrone, South Burlington, VT (US); Sudeep Mandal, Bangalore (IN)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/210,403

(22) Filed: Jul. 14, 2016

(51) Int. Cl.
*G11C 15/00* (2006.01)
*G11C 15/04* (2006.01)
*G11C 15/06* (2006.01)
*H01L 25/065* (2006.01)

(52) U.S. Cl.
CPC .......... *H01L 25/0657* (2013.01); *G11C 15/04* (2013.01); *G11C 15/06* (2013.01); *H01L 2225/0652* (2013.01); *H01L 2225/06548* (2013.01); *H01L 2225/06558* (2013.01); *H01L 2225/06572* (2013.01)

(58) Field of Classification Search
CPC ......... H01L 25/0657; H01L 2225/0652; H01L 2225/06548; H01L 2225/06558; H01L 2225/06572; G11C 15/04; G11C 15/06
USPC .................................................. 365/49.1, 63
See application file for complete search history.

(56) References Cited

U.S. PATENT DOCUMENTS

| | | | |
|---|---|---|---|
| 8,436,639 B2 | 5/2013 | Goel | |
| 8,621,151 B2 | 12/2013 | Kim | |
| 8,754,704 B2 | 6/2014 | Huang | |
| 8,949,534 B2 | 2/2015 | Lee et al. | |
| 8,988,130 B2 | 3/2015 | Kim et al. | |
| 9,065,722 B2* | 6/2015 | Thottethodi | H04L 45/021 |
| 9,401,312 B1* | 7/2016 | Kannan | H03K 19/1735 |
| 9,432,298 B1* | 8/2016 | Smith | H04L 49/9057 |
| 2011/0090004 A1* | 4/2011 | Schuetz | G11C 29/808 327/564 |
| 2012/0068229 A1* | 3/2012 | Bemanian | H01L 25/0652 257/209 |

(Continued)

FOREIGN PATENT DOCUMENTS

TW      201220374      5/2012
TW      201432871      8/2014

OTHER PUBLICATIONS

Taiwanese Office Action in related Application No. 105126732 dated Mar. 8, 2017, 8 pages.

(Continued)

*Primary Examiner* — Ly D Pham
(74) *Attorney, Agent, or Firm* — David Cain; Andrew M. Calderon; Roberts Mlotkowski Safran Cole & Calderon, P.C.

(57) ABSTRACT

The present disclosure generally relates to semiconductor structures and, more particularly, to intelligent through silicon via sharing in 3D-IC integrated structures and methods of manufacture. The structure includes: a plurality of stacked dies each containing at least one macro device; and a layer structure positioned between the plurality of stacked dies which comprises a control structured to route signals between the at least one macro device of a first stacked die and the at least one macro device of a second stacked die of the plurality of stacked dies.

13 Claims, 4 Drawing Sheets

(56) References Cited

U.S. PATENT DOCUMENTS

| | | | |
|---|---|---|---|
| 2012/0228760 A1* | 9/2012 | Lim | H01L 23/60 257/737 |
| 2012/0242346 A1* | 9/2012 | Wang | G01B 31/318513 324/537 |
| 2013/0159630 A1 | 6/2013 | Lichmanov | |
| 2014/0085959 A1* | 3/2014 | Saraswat | G11C 7/10 365/63 |
| 2014/0176187 A1* | 6/2014 | Jayasena | H03K 19/1776 326/39 |
| 2014/0181417 A1* | 6/2014 | Loh | G06F 12/0828 711/141 |
| 2014/0181427 A1* | 6/2014 | Jayasena | G06F 9/3004 711/154 |
| 2014/0181428 A1* | 6/2014 | Hsu | G06F 12/00 711/154 |
| 2014/0181458 A1* | 6/2014 | Loh | G06F 12/1027 711/206 |
| 2014/0281311 A1* | 9/2014 | Walker | G06F 3/0631 711/162 |
| 2015/0016172 A1* | 1/2015 | Loh | G11C 5/02 365/51 |
| 2015/0022262 A1* | 1/2015 | Du | H01L 21/77 327/565 |
| 2015/0085556 A1* | 3/2015 | Chan | G11C 11/412 365/72 |
| 2015/0091179 A1* | 4/2015 | Shenoy | H01L 23/5381 257/774 |
| 2015/0171015 A1* | 6/2015 | Mahajan | H01L 23/5381 257/712 |
| 2015/0185274 A1* | 7/2015 | Hwang | G01B 31/318513 324/750.3 |
| 2015/0199126 A1* | 7/2015 | Jayasena | G11C 11/005 711/103 |
| 2016/0092396 A1* | 3/2016 | Rusu | G06F 15/76 712/1 |
| 2016/0173101 A1* | 6/2016 | Gao et al. | H03K 19/1776 326/41 |
| 2016/0211241 A1* | 7/2016 | Law | H01L 25/0657 |
| 2017/0040047 A1* | 2/2017 | Ware | G11C 11/4076 |
| 2017/0125383 A1* | 5/2017 | Liu | H01L 25/0657 |

OTHER PUBLICATIONS

Notice of Allowance in related Taiwanese Application No. 105126732 dated Nov. 10, 2017, 3 pages.

\* cited by examiner

US 9,871,020 B1

THROUGH SILICON VIA SHARING IN A 3D INTEGRATED CIRCUIT

FIELD OF THE INVENTION

The present disclosure generally relates to semiconductor structures and, more particularly, to intelligent through silicon via sharing in 3D integrated circuit structures and methods of manufacture.

BACKGROUND

A desire for increased performance improvements, such as increased bandwidth, reduced latency, and lower power, among other improvements, is fostering an implementation of three-dimensional integrated circuit (3D-IC) designs. In a 3D-IC, silicon wafers and/or dies are stacked and interconnected vertically using through silicon vias (TSVs) to behave as a single device in order to achieve desired performance improvements. The TSVs enable communication between the dies in the 3D stack. However, the TSVs are limited in number and use valuable real-estate on the chip.

SUMMARY

In an aspect of the disclosure a structure comprises: a plurality of dies each containing at least one macro device; a layer structure positioned between the dies; a combination of routers within the layer structure; and a plurality of through silicon vias (TSVs) extending from the layer structure and connected to the macro device of each die for data transfer between the dies through the routers.

In an aspect of the disclosure a structure comprises: a plurality of dies each containing at least one macro device; an interposer between the dies; a combination of multiplexers, demultiplexers and control blocks within the interposer; and a plurality of through silicon vias (TSVs) extending from the interposer and connected to the macro device of each die for communication between the dies by routing signals through the multiplexers, demultiplexers and control blocks.

In an aspect of the disclosure a structure comprises: a plurality of dies each containing at least one circuit and a control logic; a controller positioned between the dies and driven by the control logic; and a plurality of through silicon vias (TSVs) extending in communication with the controller and connected to the circuit of each die for communication between the dies by routing signals as directed by the control logic.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The disclosure generally relates to semiconductor structures and, more particularly, to intelligent through silicon via sharing in a 3D-IC integrated structure and methods of manufacture. In embodiments, an intelligent layer is positioned between a stack of dies, which provides TSV sharing to ensure optimal usage and communication between the dies in comparison to conventional 3D-IC structures. That is, in embodiments, the intelligent layer described herein provides sharing across any number of TSVs for a 3D-IC structure.

In embodiments, the intelligent layer can be formed as an interposer layer positioned between two or more stacked dies. This intelligent layer can include multiplexers and demultiplexers and a control block. The multiplexers and demultiplexers can be selectively controlled by the control block as determined by a control logic to allow for dynamic rerouting of signals through TSVs. This eliminates the need for a new layer in a legacy chip.

The structures of the present disclosure can be manufactured in a number of ways using a number of different tools. In general, though, the methodologies and tools are used to form structures with dimensions in the micrometer and nanometer scale. The methodologies, i.e., technologies, employed to manufacture the structure of the present disclosure have been adopted from integrated circuit (IC) technology. For example, the structures are built on wafers and are realized in films of material patterned by photolithographic processes on the top of a wafer. In particular, the fabrication of the structure uses three basic building blocks: (i) deposition of thin films of material on a substrate, (ii) applying a patterned mask on top of the films by photolithographic imaging, and (iii) etching the films selectively to the mask.

Figure 1:
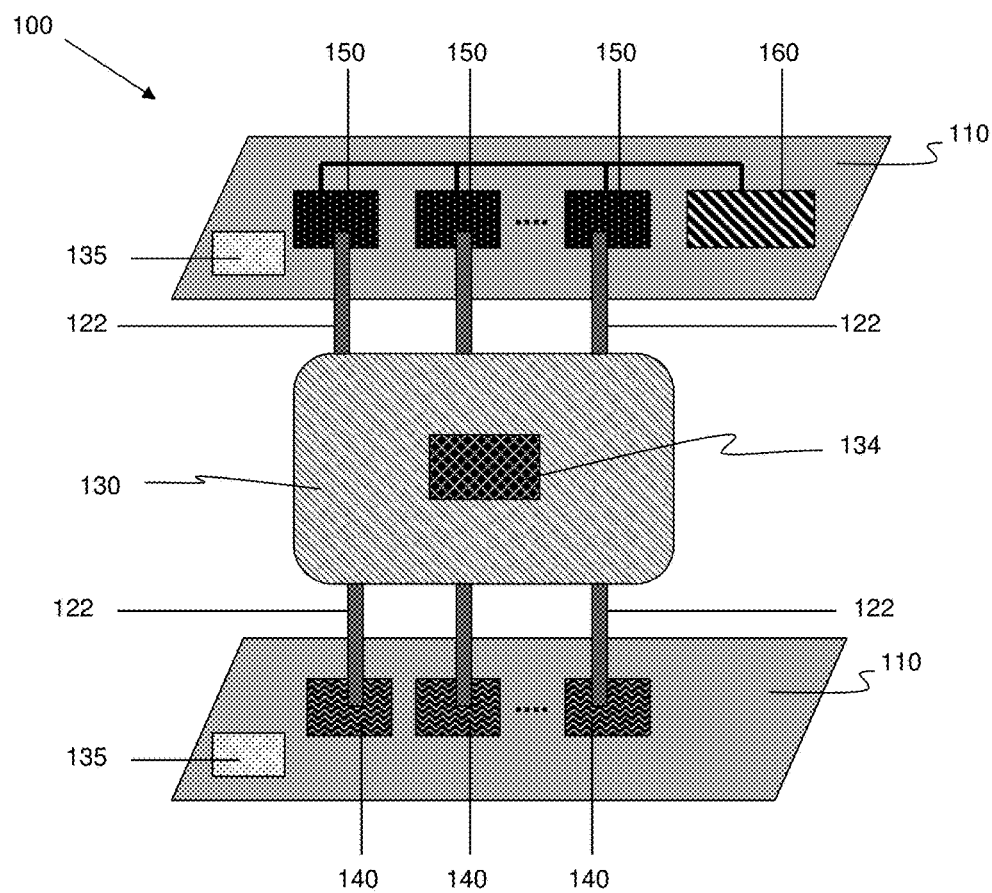
FIG. 1 shows a 3D-IC structure using an intelligent layer and respective fabrication processes in accordance with aspects of the present disclosure.

FIG. 1 shows a structure and respective fabrication processes in accordance with aspects of the present disclosure. More specifically, the structure is a three-dimensional integrated circuit (3D IC) structure 100 which includes a plurality of dies 110. The dies 110 can be a chip composed of any suitable semiconductor wafer material, e.g., silicon, although other materials are contemplated herein, on which a given functional circuit is fabricated.

Still referring to FIG. 1, the plurality of dies 110 communicate with one another in the stacked structure enabled by through silicon vias (TSVs) 122 structures. In embodiments, the TSVs 122 can be vertical interconnects that extend through a wafer and can connect the dies 110 in a vertical arrangement on top of each other. The TSVs 122 can be composed of different types of conductive material, e.g., copper or tungsten, or other suitable materials, formed by conventional lithography, etching and deposition processes as should be understood by those of skill in the art. Further, the TSVs 122 can be connected to an intelligent layer 130 using solder bonds, such as the solder bonds 220 and 320 shown in FIGS. 2 and 3, for example. The various structures and components of solder bonds for each of the TSVs 122 can include a land structure and a bond pad.

In embodiments, the TSVs 122 can electrically connect macro devices 140, 150, 160 of the different dies 110. In embodiments, the macro devices can be, e.g., cores 140, caches 150 and memory devices 160, among other suitable macro devices. In embodiments, memory devices 160 can have their own dedicated TSV structures, such as TSV structures 122. It should be understood by those of skill in the art, that the number of macro devices can be adjusted according to a user's needs. For example, the number of cores 140 and caches 150 can be increased to fit the implementation of the 3D IC 100.

The TSVs 122 are limited in number due to limited area on the chip in a 3D IC. Therefore, the ability for intelligent sharing of information between the different macros using the TSVs 122 is needed to ensure optimal usage and communication between the dies 110. Accordingly, as shown in FIG. 1, the TSVs 122 extend into and from an intelligent layer 130. This intelligent layer 130 can also be referred to as an intelligent switch box (ISS), and is structured and responsible for regulating and controlling the flow of data between the chips on the 3D stack through the TSVs 122. More specifically, the intelligent layer 130 allows for resource allocation of the TSVs 122 to optimize communication between the dies 110 and more particularly between the different macro devices 140, 150, 160 available in 3D IC 100. In embodiments, the intelligent layer 130 acts as a logic module comprising intelligent decision making hierarchies to allow flow of data between these macro devices, such as between the cores 140 and the caches 150 through the TSVs 122 of the 3D IC stack 100. It is noted that since the TSVs 122 are a limited number, the pins extending from the TSVs and into the macro devices 140, 150, 160 are limited in number as well. Therefore, intelligent sharing of the TSVs 122 allows the availability of additional resources.

In embodiments, the intelligent layer 130 uses combined address busses and data stream from a central processing units (CPUs) 135 of the 3D IC 100 in combination with the control box 134 to control the flow and access to shared common TSVs 122 between the cores 140 and the caches 150. For example, the intelligent layer 130 can use history tables, priority queues, and programmed priority, among other examples, as directed by an operating system or any other controller application located within the control box 134 of the 3D IC 100 to determine the best balance of resources for efficient use of cache 150 and cores 140. More specifically, the intelligent layer 130 can direct data through the TSV 122 to a select cache 150 from a particular core 140 based on real time demand from that particular core 140 for the use of memory. This allows the TSVs 122 to form functional links between multiple cores 140 of the lower die and multiple caches 150 of the upper die, as illustrated in FIG. 1.

Figure 2:
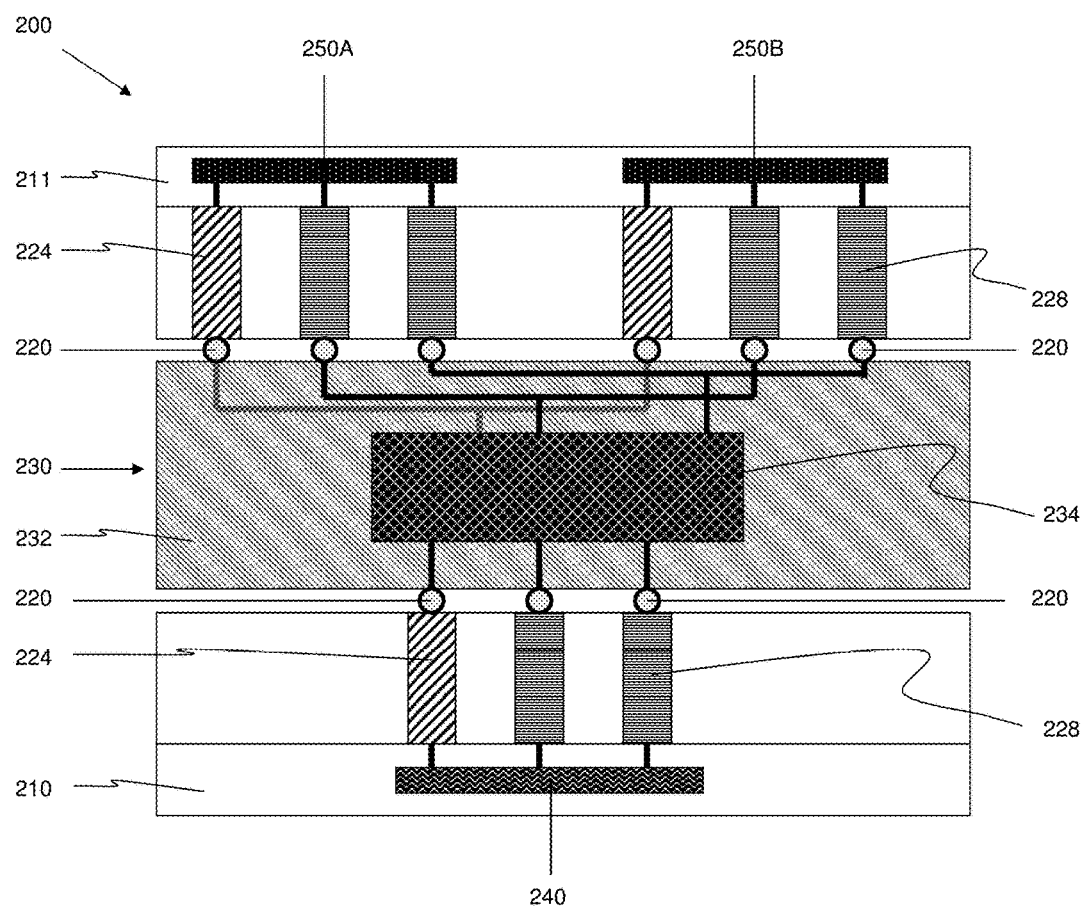
FIG. 2 shows a 3D-IC structure using a control block and respective fabrication processes in accordance with additional aspects of the present disclosure.

FIG. 2 shows a 3D-IC structure using a control block and respective fabrication processes in accordance with additional aspects of the present disclosure. In particular, in FIG. 2, a 3D IC structure 200 is shown, and more specifically an illustration of a data bus and an address bus using an interposer is provided. Similar to the structure shown in FIG. 1, the 3D IC 200 includes a plurality of dies, shown as lower die 210 and upper die 211, vertically stacked upon each other. The TSVs include an address TSV bus 224 and a data TSV bus 228; although other TSV types and amounts of TSVs are also contemplated for use herein.

As previously described, the TSVs 224 and 228 are vertical interconnects that electrically connect the dies 210 and 211 in a vertical arrangement on top of each other. Further, the TSVs 224 and 228 can be made of any conductive material, e.g., copper or tungsten, among other materials, and can be connected using solder bonding technologies 220, as shown in FIG. 2. Further, the flow of data between the chips in the 3D IC stack 200 through the TSVs 224 and 228, can be shared between macro devices of each die 210 and 211, such as between the core 240 in the lower die 210 and the caches 250A and 250B in the upper die 211, and memory devices, for example, by using the intelligent layer structure 230.

Still referring to FIG. 2, TSVs 224 and 228 are intelligently shared in the 3D IC 200 to ensure optimal usage and communication between the dies 210 and 211. Specifically, as shown in FIG. 2, the TSVs 224 and 228 extend into and from an intelligent layer structure 230. This intelligent layer 230 regulates and controls the flow of data between the chips on the 3D stack through the TSVs 224 and 228. More specifically, the intelligent layer 230 is formed of an interposer layer 232, such as a silicon interposer. Further, within the interposer layer 232 is a control block 234, which allows for the re-routing and re-allocation of the TSVs 224 and 228 to optimize communication between the dies 210 and 211. More specifically, the control block 234 controls the communication between the macro devices of each die 210 and 211, such as between the core 240 of the lower die 210 and the caches 250A and 250B of the upper die 211.

Still referring to FIG. 2, the control block 234 can include various logic devices to allow for the re-routing and re-allocation of the TSVs 224 and 228. More specifically, the control block 234 can include multiplexers, demultiplexers and other combinational control logic which can selectively re-route signals between the different macro devices, e.g., cores 240 and caches 250A and 250B. That is, a combination of multiplexers and demultiplexers can be used for data transfer through the TSVs 224 and 228 between the dies 210 and 211 in the 3D IC 200.

During operation, the control block 234 receives the request from the address TSV 224 and the data TSV 228 that originated from the core 240. The address TSV 224 and the data TSV 228 are reserved for sending address signals and data signals respectively. These signals are re-routed via the control block 234 to the respective destinations. In FIG. 2, the respective destination would be cache 250A and 250B. As a more specific example, when core 240 is communicating with first cache 250A, the address TSV 224 and the two data TSVs 228 can be routed by the control block 234 to communicate with the first cache 250A. On the other hand, if the core 240 determines that it needs to communicate with the second cache 250B, the control block 234 re-routes signals such that address TSV 224 and the data TSV's 228 from the core 240 communicate with the second cache 250B, re-routed via the control block 234. Therefore the control block 234 acts as signal router.

In embodiments, the intelligent layer 230 uses history tables, priority queues, and programmed priority, among other examples, to determine the best balance of resources for efficient use of cache 250 and routing of the signals. More specifically, the intelligent layer 230 can direct data through any of the TSVs 224, 228 to a select cache 250 from a particular core 240 based on real time demand from that particular core 240 for the use of memory.

Figure 3:
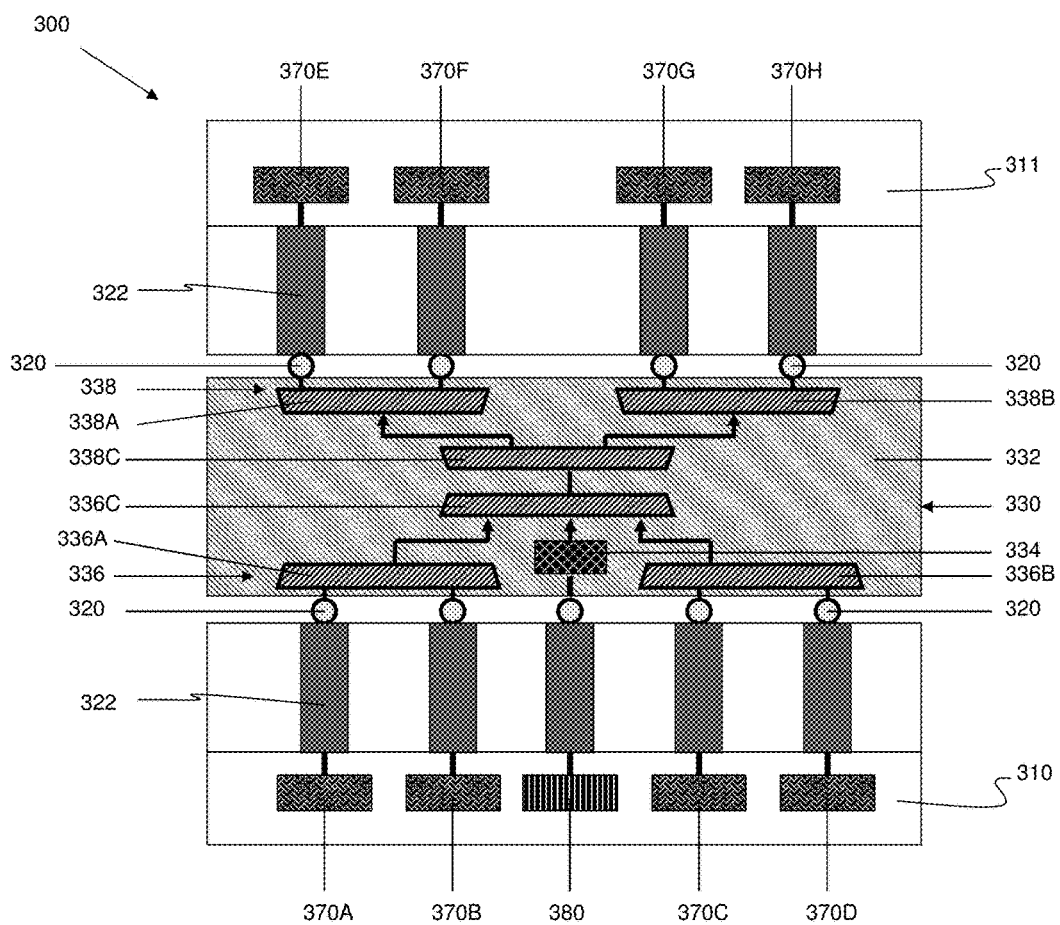
FIG. 3 shows a 3D-IC structure using an intelligent layer and respective fabrication processes in accordance with additional aspects of the present disclosure.

FIG. 3 shows a 3D-IC structure using an intelligent layer and respective fabrication processes in accordance with additional aspects of the present disclosure. In particular, the 3D IC structure 300 includes a plurality of dies such as lower die 310 and upper die 311. The lower die 310 and upper die 311 which are vertically stacked in relation to one another, with a plurality of TSVs 322 extending from and into the dies 310 and 311. The TSVs 322 in combination with the intelligent layer 330 allow for communication between the dies 310 and 311 so that data can flow between the macros found within each die 310 and 311. As shown in FIG. 3, the macro devices can be various circuits 370A-370H and/or a control logic 380, among other suitable macro devices. For example, the circuits 370 are abstracted for core, processing logic or any other piece of logic which requires communication to logic on another die 310 and/or 311. The circuits 370 can be any number in each die 310 and 311 that fits the user's needs, and can be numbered 1 through n, for example.

Still referring to FIG. 3, the intelligent layer 330 will control the allocation of the TSVs 322 amongst the different macro devices 370A, 370B, 370C, 370D, 370E, 370F, 370G and 370H and 380. More specifically, the control block 334 assists in re-routing and re-allocating signals through the TSVs 322. As shown in FIG. 3, in addition to the control block 334, the intelligent layer 330 includes a plurality of router devices 336, 338 to assist in selectively re-routing and re-allocating signals. More specifically, these router devices can be a plurality of multiplexers 336A, 336B and 336C and demultiplexers 338A, 338B and 338C.

In embodiments, the multiplexers 336A-336C and demultiplexers 338A-338C allow for the direction and distribution of signals through the intelligent layer 330 so that certain TSVs 322 can provide communication between certain macros. The routing of the signals can be accomplished by the use of the multiplexers 336A-336C and demultiplexers 338A-338C, which is determined and controlled by the intelligent layer 330. For example, if data needs to flow from the first circuit 370A to the fifth circuit 370E, the first multiplexer 336A is enabled so that the signal (i.e., the data) is transferred to the third multiplexer 336C, which then communications with the third demultiplexer 336C, which outputs the signal to the first demultiplexer 338A. The first demultiplexer 338A will then direct the signal to the fifth circuit 370E through the corresponding TSV 322 in communication with the fifth circuit 370E.

Further, the number of multiplexers 336A-336C and demultiplexers 338A-338C can be adjusted, e.g., increased and decreased, depending on the resource allocation requirements. One skilled in the art would understand that other combinational control logic devices can be used in the intelligent layer 330 to selectively re-route signals, such as a decoder or any other device made of AND, OR, NOT, NAND, or NOR gates.

In addition to the circuit devices 370, the lower die 310 includes a control logic 380, as shown in FIG. 3. This control logic 380 can include an operating system (OS), history tables, priority queues, and programmed priority, among other examples, as directed by the OS or any other controller application to determine the best balance of resources for efficient use of circuit 370. More specifically, the control logic 380 assists the intelligent layer 330 in determining the best balance of resources (i.e., TSV 322) for the decision making process for re-routing and re-allocating signals through TSVs 322. This allows the TSVs 322 to form functional links between multiple circuits 370 of the lower die 310 and multiple circuits 370 of the upper die 311, as illustrated in FIG. 3. In alternative or additional embodiments, the control logic 380 can reside in any die, e.g., both or either of the lower die 310 and upper die 311.

Still referring to FIG. 3, in embodiments, the multiplexers 336A-336C and demultiplexers 338A-338C enable dynamic signal re-routing. For example, as shown in FIG. 3, the multiplexers 336A-336C and demultiplexers 338A-338C are connected such that the required circuits 370 in the lower die 310 are connected to the required logic on upper die 311 with the flexibility of dynamic re-routing. In a more complex architecture, there could be combinatorial logic included in between the multiplexers 336A-336C to demultiplexers 338A-338C path. Also, in embodiments, there could be direct connection from the lower die 310 to the upper die 311 through the interposer 332; hard wired using a "through via" through the interposer 332. In general, though, relatively more complex scenarios are possible depending on the design and architecture of the 3D IC. It should be noted that each level of multiplexers 336A-336C and demultiplexers 338A-338C can be 1 millimeter (mm) thick, among other sizes.

In a more specific example, the control block 334 contains control architecture and cross bar structures implemented in the interposer 332 using combinatorial and/or sequential logic or a combination thereof. In embodiments, control signals are sent to the control block 334 by the control logic 380 in one of the dies 310 or 311, or both. The control block 334 subsequently selectively enables and/or disables the multiplexers 336A-336C to re-route signals. The output of the control block 334 comprises a control to "enable" and "select" lines to all the multiplexers 336A-336C to demultiplexers 338A-338C. To keep the validity of the data, the data is split between the multiplexers. It should be noted that while only one control block 334 is illustrated in FIG. 3, any number of control blocks can be implemented within the 3D IC 300.

As an example of the re-allocation of the TSVs 322, a selective control of the multiplexers 336A-336C to the demultiplexers 338A-338C can be provided by the control block 334, as determined by control logic 380. This allows for dynamic re-routing of the signals. In a more specific example, the routing of a first circuit 370A to an eighth circuit 370H, if needed, would be accomplished by enabling an input (S0) of a first multiplexer 336A, enabling an input (S0) of a third multiplexer 336C, and then enabling an input (S1) of a third demultiplexer 338C and enabling an input (S1) of a second demultiplexer 338B. Additionally, the routing of data from a third circuit 370C to a sixth circuit 370F would be accomplished by enabling an input (S0) of a second multiplexer 336B, enabling an input (S1) of a third multiplexer 336C, enabling an input (S0) of a third demultiplexer 338C and enabling an input (S1) of a first demultiplexer 338A, and so on.

Referring to FIGS. 1-3, the structures shown in 3D ICs 100, 200 and 300 of FIGS. 1-3, can be increased and decreased depending on the user's needs. As an example, the number of dies that are vertically stacked in relation to one another can be increased by "n". Further, the number of intelligent layers can be increased to match not only an increased number of dies, but also to maximize resource allocation. For example, if the number of CPUs are increased, the number of intelligent layers can be increased by "n" to match the resource allocation demands. Further, as the number of intelligent layers is increased, the number of logic devices present within the 3D IC can increase because they are contained in the intelligent layers. Additionally, the number of TSVs can be increased, especially if there are TSVs that are dedicated and cannot be manipulated for resource allocation. For these dedicated TSVs, the intelligent sharing through the intelligent layer has no control over these TSVs.

Figure 4:
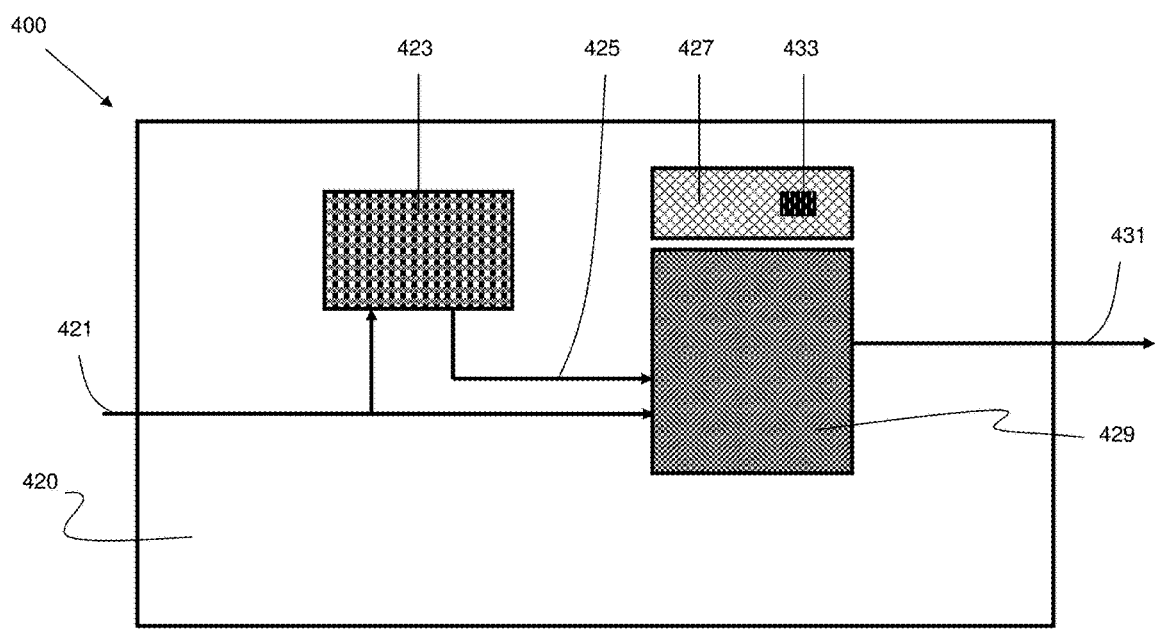
FIG. 4 shows a flow diagram for prioritization of TSV sharing in a 3D-IC structure in accordance with aspects of the present disclosure.

FIG. 4 is an overview of an intelligent layer in accordance with aspect of the present disclosure. More specifically, FIG. 4 is representative of a method of transferring and sharing bandwidth across common TSV structures between dies in a 3D stack, which can consist of an optimized bus protocol to perform various functions. These functions include the ability to analyze a control signal from a requesting source, with the source present on a specific die level. An additional function is the ability to determine and allocate resources to a requesting source, with the resource situated at another die level. A further function is the ability to select and enable shared TSVs to enable the inter-die communication between the allocated resource and the requesting source. An additional function is the ability to control the optimal transfer of inter-die data between source and destination for the period of communication. Another function of the optimized bus protocol is the ability to deallocate a resource based on a priority call from another requesting source. Again, the optimized bus protocol can perform these various functions through the use of history tables, priority queues, and programmed priority, among other examples, as directed by an operating system or any other controller application to determine the best balance of resources for efficient use of a resource (i.e., a TSV).

Still referring to FIG. 4, the prioritization process 400 begins by receiving an incoming request 421, which can be sent by a macro device in a die, for example. The incoming resource request 421 can be received by a content addressable memory ("CAM") device 423, which, in embodiments, can contain the prioritization protocols, e.g., logic, such as a history table, a priority queue, and a programmed priority, among other examples.

As an example of how the CAM device 423 operates, there can be two different resource requests, A and B. Both A and B requests will enter the CAM device 423, which contains a history table, as an example. The CAM device 423, through the use of the history table, will keep an account of how many times it received requests A and B, and will keep track of this history. In other words, the history table can determine the frequency of the request. For example, the history table can store the following information: request A has been sent 1000 times and request B has only been sent 100 times. Therefore, in this example, the CAM device 423 will make the determination that request "A" needs more bandwidth due to its increased frequency compared to request B. This information can then be fed from the CAM output 425 to the priority control device 429. The priority control device 429 will then carry out the resource allocation order that was obtained from the CAM output 425.

In embodiments, though, the priority control device 429 does not have to receive a priority order from the CAM device 423 directly. Instead, in certain situations, the incoming resource request 421 can bypass the CAM device 423 and go directly to the priority control device 429, depending on the availability of the TSVs and the current workload of the 3D IC.

The priority control device 429 carries out the resource allocation order so that the proper TSVs can be utilized. The priority control device 429 can be controlled by an operating system that is pre-loaded onto a read only memory (ROM) device 427. The ROM device 427 can be any standard ROM device. The priority control device 429 can implement any combinatorial logic, sequential logic or a combination thereof. The operating system 433 then directs the priority control device 429 to send out the commands through output 431 to select the appropriate TSVs to fulfill the commands. The output 431 can be received by the various logic devices previously discussed, such as multiplexers and demultiplexers, among other examples.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprising:
a plurality of stacked dies each containing at least one macro device; and
a layer structure positioned between the plurality of stacked dies which comprises a control structured to route signals between the at least one macro device of a first stacked die and the at least one macro device of a second stacked die of the plurality of stacked dies, wherein the control includes a control logic to selectively and dynamically route signals through a through silicon via (TSV) allocation which connects to the at least one macro device of a first die and a second die of the plurality of stacked dies, wherein
the control comprises at least one multiplexer and at least one demultiplexer which forward the signals throughout the layer structure,
the control logic selectively enables and disables the at least one multiplexer and the at least one demultiplexer to dynamically route the signals through the TSV allocation,
the control logic selectively routes the signals through different TSV allocations,
the control logic includes at least one of history tables, priority queues, programmed priority, and controller application,
the layer structure further comprises a content addressable memory (CAM) which stores the history tables, and
the history tables keep an accounting of requests from the at least one macro device to determine a frequency of the request.

2. The structure of claim 1, wherein the at least one macro device of the first stacked die and the at least one macro device of the second stacked die include a plurality of macro devices and the control structured to route signals between any of the plurality of macro devices of the first stacked die and the plurality of macro devices of the second stacked die of the plurality of stacked dies.

3. The structure of claim 2, wherein the plurality of macro devices include at least one core device and at least one cache device.

4. The structure of claim 2, wherein the plurality of macro devices of the first stacked device and the plurality of macro devices of the second stacked device are connected by a plurality of through silicon vias (TSVs) extending from the layer structure.

5. The structure of claim 4, wherein the TSVs include at least one data TSV and at least one address TSV.

6. The structure of claim 1, wherein the layer structure is a silicon interposer.

7. The structure of claim 1, wherein the control logic is at least one of combinatorial logic, sequential logic or a combination thereof.

8. A structure comprising:
a plurality of dies each containing at least one macro device; and
an interposer positioned between the plurality of dies which comprises a control block and a control logic to route signals between the at least one macro device of a first die and the at least one macro device of a second die of the plurality of dies and at least one multiplexer and at least one demultiplexer which route the signals between the plurality of dies, wherein the control logic selectively enables and disables the at least one multiplexer and the at least one demultiplexer to dynamically route signals through a plurality of through silicon vias (TSVs) between the plurality of dies, wherein
the control comprises at least one multiplexer and at least one demultiplexer which forward the signals throughout the layer structure,
the control logic selectively enables and disables the at least one multiplexer and the at least one demultiplexer to dynamically route the signals through the TSV allocation,
the control logic selectively routes the signals through different TSV allocations,
the control logic includes at least one of history tables, priority queues, programmed priority, and controller application,
the layer structure further comprises a content addressable memory (CAM) which stores the history tables, and
the history tables keep an accounting of requests from the at least one macro device to determine a frequency of the request.

9. The structure of claim 8, wherein the macro devices include at least one core device and at least one cache device.

10. The structure of claim 8, wherein the interposer further comprises a content addressable memory (CAM) which stores the history tables.

11. A structure comprising:
a plurality of stacked dies each containing at least one circuit;
a layer structure positioned between the plurality of stacked dies which comprises a control block and a control logic to route signals between the at least one circuit of a first stacked die and the at least one circuit of a second stacked die of the plurality of stacked dies; and
a plurality of through silicon vias (TSVs) selectively activated by and extending from the layer structure and connected to the least one circuit of the first die and to the least one circuit device of the second die, wherein
the control block comprises at least one multiplexer and at least one demultiplexer which forward the signals throughout the layer structure,
the control logic selectively enables and disables the at least one multiplexer and the at least one demultiplexer to dynamically route the signals through the TSV allocation,
the control logic selectively routes the signals through different TSV allocations,
the control logic includes at least one of history tables, priority queues, programmed priority, and controller application,
the layer structure further comprises a content addressable memory (CAM) which stores the history tables, and
the history tables keep an accounting of requests from the at least one macro device to determine a frequency of the request.

12. The structure of claim 11, wherein the layer structure further comprises multiplexers and demultiplexers selectively controlled by the control block as determined by the control logic to allow for dynamic rerouting of signals through the TSVs.

13. The structure of claim 12, wherein the layer structure uses at least one of history tables, priority queues and programmed priority to allow for the dynamic rerouting of signals through the TSVs.

* * * * *